US 9,032,612 B2

(12) United States Patent
Yamamoto et al.

(10) Patent No.: US 9,032,612 B2
(45) Date of Patent: May 19, 2015

(54) MOUNTING HEAD AND COMPONENT MOUNTING APPARATUS

(75) Inventors: Shinji Yamamoto, Yamanashi (JP); Yutaka Kinoshita, Yamanashi (JP); Nobuhiro Nakai, Yamanashi (JP); Hiroyuki Fujiwara, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 189 days.

(21) Appl. No.: 13/978,255

(22) PCT Filed: Sep. 11, 2012

(86) PCT No.: PCT/JP2012/005763
§ 371 (c)(1),
(2), (4) Date: Jul. 3, 2013

(87) PCT Pub. No.: WO2013/136383
PCT Pub. Date: Sep. 19, 2013

(65) Prior Publication Data
US 2014/0215812 A1    Aug. 7, 2014

(30) Foreign Application Priority Data

Mar. 12, 2012  (JP) ................ 2012-054153

(51) Int. Cl.
*B23P 19/00*    (2006.01)
*H05K 13/04*    (2006.01)

(52) U.S. Cl.
CPC ........ *H05K 13/0413* (2013.01); *H05K 13/0452* (2013.01)

(58) Field of Classification Search
CPC .................................................... H05K 13/04
USPC .................... 29/727, 739–743; 348/370, 374; 700/95–97, 121; 901/17, 40–47
See application file for complete search history.

(56) References Cited

U.S. PATENT DOCUMENTS

| 6,860,002 | B2 * | 3/2005 | Oyama ........................... 29/740 |
| 6,971,161 | B1 * | 12/2005 | Maenishi et al. ............... 29/832 |
| 7,036,215 | B2 * | 5/2006 | Kodama ......................... 29/832 |
| 8,057,015 | B2 * | 11/2011 | Oguchi .......................... 347/50 |

(Continued)

FOREIGN PATENT DOCUMENTS

| JP | 2000-036696 A | 2/2000 |
| JP | 2005-093845 A | 4/2005 |

(Continued)

OTHER PUBLICATIONS

International Search Report for PCT/JP2012/005763 dated Dec. 11, 2012.

*Primary Examiner* — Paul D Kim
(74) *Attorney, Agent, or Firm* — Pearne & Gordon LLP (57) ABSTRACT

A mounting head 16 includes shaft members 23 respectively provided with suction nozzles 22, rotation driving motors 24 for individually conducting rotary movements of the shaft members 23, and vertical movement driving motors 25 which are arranged in a staggered arrangement in an opposite direction to a staggered arrangement of the shaft members 23, and adapted to individually conduct vertical movements of the shaft members 23. The rotation driving motors 24 directly drive the shaft members 23, and the vertical movement driving motors 25 move the shaft members 23 up and down, together with the rotation driving motors 24.

6 Claims, 9 Drawing Sheets

(56) References Cited

U.S. PATENT DOCUMENTS

2011/0192021 A1 8/2011 Tanaka et al.
2013/0258178 A1* 10/2013 Koshimura et al. ........... 348/370

FOREIGN PATENT DOCUMENTS

| JP | 2007-200914 A | 8/2007 |
| JP | 2010-93177 A | 4/2010 |

* cited by examiner

MOUNTING HEAD AND COMPONENT MOUNTING APPARATUS

TECHNICAL FIELD

The present invention relates to a mounting head which has a plurality of shaft members extending in a vertical direction and respectively provided with suction nozzles at their lower ends, and a component mounting apparatus provided with this mounting head.

BACKGROUND ART

A component mounting apparatus includes a board positioning part for positioning a board, a component supply part for supplying a component, and a mounting head for sucking the component supplied from the component supply part and mounting the component on the board. The mounting head has a plurality of shaft members extending in a vertical direction and respectively provided with suction nozzles at their lower ends.

In the mounting head of the component mounting apparatus as described above, the shaft members are allowed to move in the vertical direction and to rotate around vertical axes. The mounting head is provided with a plurality of vertical movement driving unit (motors, for example) for individually moving the shaft members in the vertical direction, and one or a plurality of rotation driving motors for rotating a plurality of the shaft members all at once. The rotation driving motor is disposed in an end part of the mounting head, and its driving power is transmitted to a plurality of the shaft members by belt transmission (Refer, for example, to Patent Document 1)

PRIOR ART DOCUMENT

Patent Document

Patent Document 1: JP-A-2010-93177

SUMMARY OF THE INVENTION

Problems that the Invention is to Solve

However, in the conventional structure as described above in which a plurality of the shaft members are rotated by the only one rotation driving motor, there is such a drawback that it is difficult to perform delicate rotation control of the respective shaft members, and an error is likely to occur in mounting the component on the board. Therefore, it is desirable to provide the rotation driving motors corresponding to the respective shaft members thereby to individually rotate a plurality of the shaft members. However, in case where the rotation driving motors corresponding to the number of the shaft members are disposed in the end part of the mounting head, the mounting head becomes bulky in its entirety. Consequently, there has been such a problem that downsizing of the component mounting apparatus, to say nothing of the mounting head, is hindered.

In view of the above, an object of the invention is to provide a mounting head and a component mounting apparatus in which delicate rotation control of shaft members can be performed, while downsizing of the mounting head is achieved.

Means for Solving the Problems

A mounting head according to the invention includes a plurality of shaft members which are extended in a vertical direction and respectively provided with suction nozzles at their lower ends, the shaft members being arranged in two rows in a staggered arrangement, a plurality of rotation driving motors which are arranged in two rows in the same staggered arrangement as the staggered arrangement of the shaft members, and adapted to individually conduct rotary movements of the shaft members, and a plurality of vertical movement driving unit which are arranged in two rows in a staggered arrangement in an opposite direction to the staggered arrangement of the shaft members, and adapted to individually conduct vertical movements of the shaft members.

Moreover, a mounting head according to the invention is the mounting head as described above, and characterized in that driving shafts of the rotation driving motors which are directed downward are connected to the shaft members, whereby the shaft members are directly driven by the rotation driving motors.

Further, a mounting head according to the invention is the mounting head as described above, and characterized in that the vertical movement driving unit move the shaft members up and down, together with the rotation driving motors which rotate the shaft members.

Moreover, a component mounting apparatus according to the invention includes a board positioning part for positioning a board, a component supply part for supplying a component, and a mounting head for sucking the component supplied from the component supply part and mounting the component on the board which is positioned by the board positioning part, wherein the mounting head includes a plurality of shaft members which are extended in a vertical direction and respectively provided with suction nozzles at their lower ends, the shaft members being arranged in two rows in a staggered arrangement, a plurality of rotation driving motors which are arranged in two rows in the same staggered arrangement as the staggered arrangement of the shaft members, and adapted to individually conduct rotary movements of the shaft members, and a plurality of vertical movement driving unit which are arranged in two rows in a staggered arrangement in an opposite direction to the staggered arrangement of the shaft members, and adapted to individually conduct vertical movements of the shaft members.

Further, a component mounting apparatus according to the invention is the component mounting apparatus as described above, and characterized in that driving shafts of the rotation driving motors which are directed downward are connected to the shaft members, whereby the shaft members are directly driven by the rotation driving motors.

Still further, a component mounting apparatus according to the invention is the component mounting apparatus as described above, and characterized in that the vertical movement driving unit move the shaft members up and down together with the rotation driving motors which rotate the shaft members.

Advantage of the Invention

According to the invention, a plurality of the shaft members provided in the mounting head are arranged in two rows in the staggered arrangement, and a plurality of the rotation driving motors for individually conducting rotary movements of the shaft members are arranged in two rows in the same staggered arrangement as the staggered arrangement of these shaft members. On the other hand, a plurality of the vertical movement driving unit for individually moving the shaft members up and down are arranged in two rows in the staggered arrangement in the opposite direction to the staggered arrangement of the shaft members. Moreover, the rotation driving motors are not attached to the end part of the mounting head, but incorporated in the mounting head. As the results, it is possible to individually rotate the shaft members thereby to perform delicate rotation control of the shaft members, while downsizing of the mounting head is achieved.

MODE FOR CARRYING OUT THE INVENTION

Figure 1:
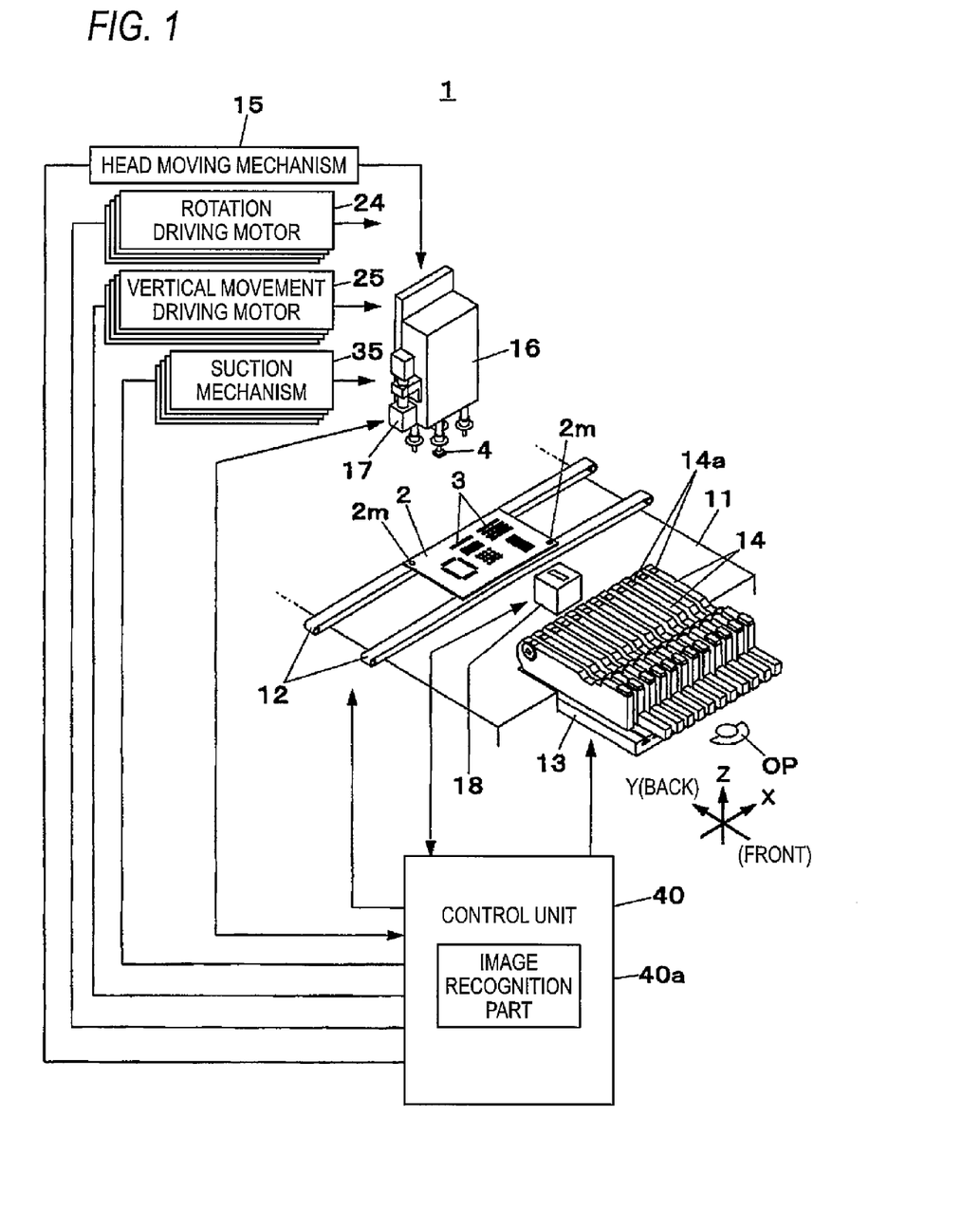
FIG. 1 is a perspective view of an essential part of a component mounting apparatus in an embodiment according to the invention.

Now, an embodiment of the invention will be described referring to the drawings. A component mounting apparatus 1 as shown in FIG. 1 repeatedly performs a series of operations including transfer and positioning of a board 2 which is transferred from a device at an upstream step side (a solder printing machine, another component mounting apparatus, for example), which is not shown, mounting of a component (electronic component) 4 onto an electrode part 3 of the board 2 which has been positioned, and transfer of the board 2 on which the component 4 has been mounted, to a device at a downstream step side (another component mounting apparatus, a testing machine, a reflow furnace, for example). In the following description, for convenience of explanation, a direction for transferring the board 2 is referred to as an X-axis direction (a right and left direction as seen from an operator OP), and a direction perpendicular to the X-axis direction in a horizontal plane is referred to as a Y-direction (a front and back direction as seen from the operator OP). Moreover, a vertical direction is referred to as a Z-axis direction.

In FIG. 1, the component mounting apparatus 1 includes a board transfer conveyer 12 which is provided in a center part of a base table 11 and extended in the X-axis direction. This board transfer conveyer 12 receives the board 2 which is transferred from the device at the upstream step side, and transfers the board 2 in the X-axis direction, and then, positions the board 2 at a predetermined working position. The board transfer conveyer 12 functions as a board positioning part in this component mounting apparatus 1. The base table 11 is provided with a feeder base 13 in an end part thereof in the Y-axis direction. A plurality of part feeders 14 are detachably mounted on this feeder base 13. The respective part feeders 14 supply the components 4 to component supply ports 14a which are provided at their ends close to the board transfer conveyer 12, and function as a component supply part in this component mounting apparatus 1.

A head moving mechanism 15 including a robot of rectangular coordinate system is provided on the base table 11, and a mounting head 16 is adapted to move in a region above the base table 11 by this head moving mechanism 15. A board camera 17 having an image pickup field directed below is attached to the mounting head 16. A component camera 18 having an image pickup field directed upward is provided on the base table 11 in a region between the board transfer conveyer 12 and the feeder base 13.

Figure 2:
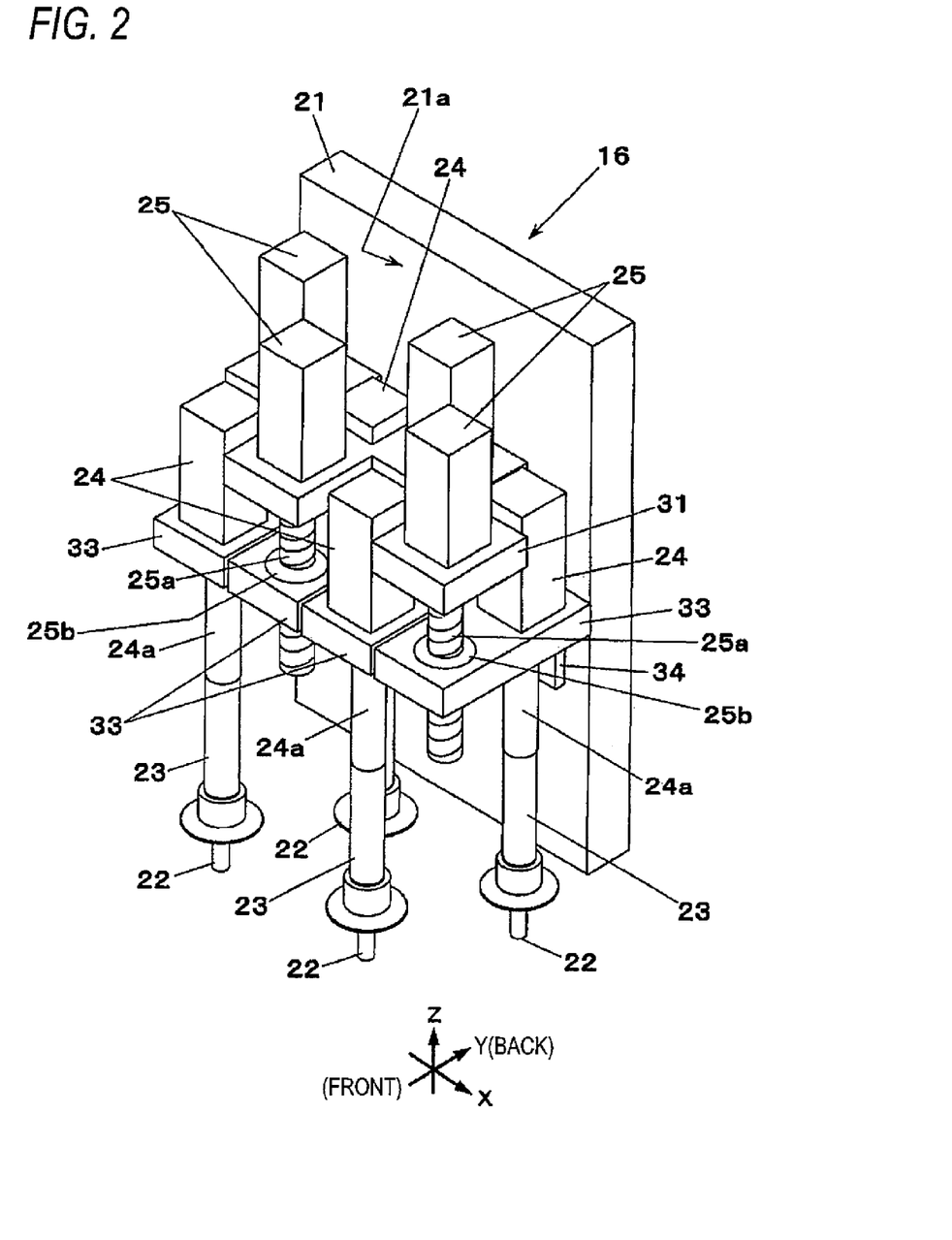
FIG. 2 is a perspective view of a mounting head which is provided in the component mounting apparatus in the embodiment according to the invention.
Figure 3:
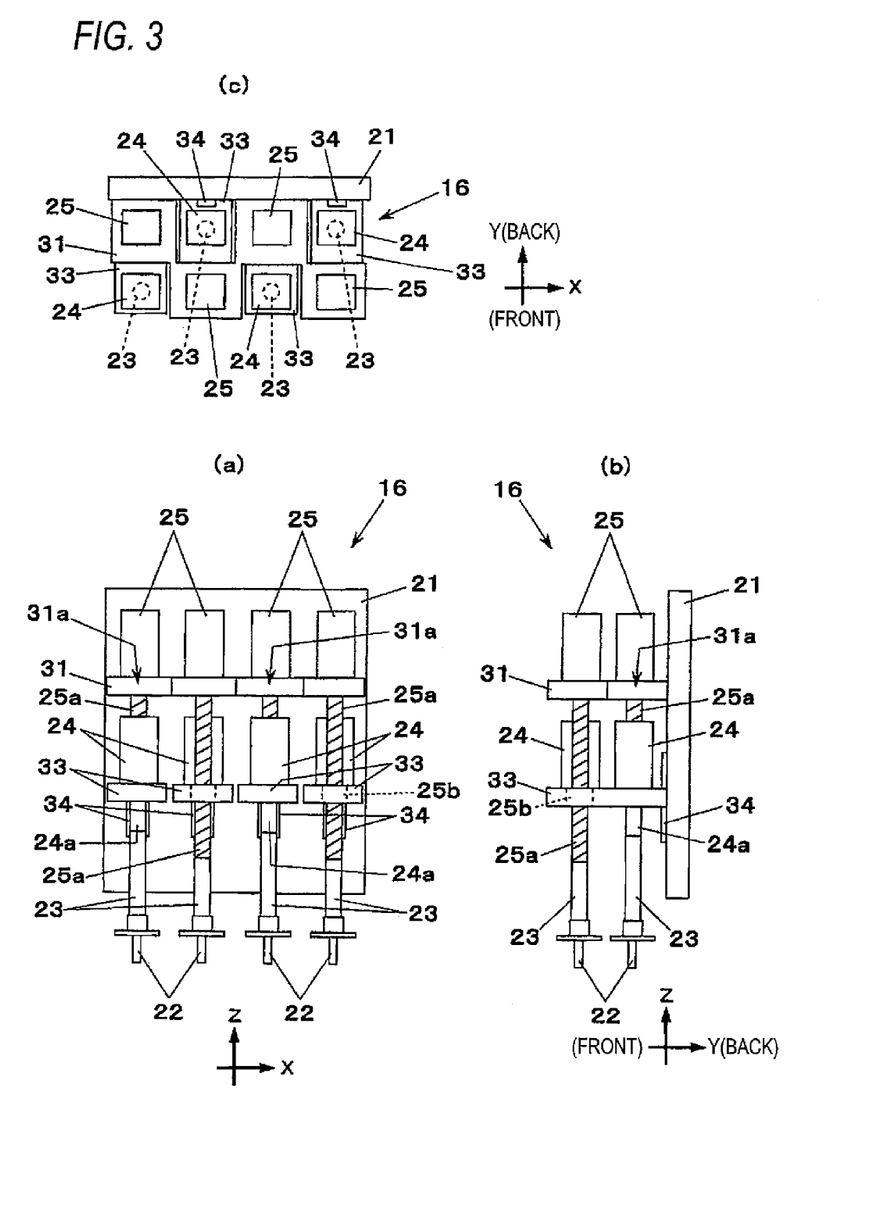
FIG. 3(a) is a front view of the mounting head in the embodiment according to the invention.
FIG. 3(b) is a side view of the same.
FIG. 3(c) is a plan view of the same.

As shown in FIG. 2 and FIGS. 3(a), (b), (c), the mounting head 16 includes a plurality of (four, in this embodiment) shaft members 23 which are extended in the vertical direction and respectively provided with suction nozzles 22 at their lower ends, a plurality of (four, in this embodiment) rotation driving motors 24 for individually conducting rotary movements of these four shaft members 23 around vertical axes, and a plurality of (four, in this embodiment) vertical movement driving motors 25, as vertical movement driving unit for individually conducting vertical movements of these four shaft members 23, all of which are provided on a front face 21a of a base member 21 in a shape of a flat plate connected to the head moving mechanism 15.

In FIG. 2 and FIGS. 3(a), (b), (c), a fixed plate 31 extending in a horizontal direction is provided on the front face 21a of the base member 21 at an intermediate position in the vertical direction. Moreover, four moving plates 33 extending in the horizontal direction and arranged in parallel in a lateral direction are provided on the front face 21a of the base member 21 below the fixed plate 31. Guide members 34 are provided on the front face 21a of the base member 21 extending in the vertical direction and arranged in parallel in the lateral direction. The moving plates 33 are guided by these guide members 34, and allowed to move in the vertical direction.

Figure 4:
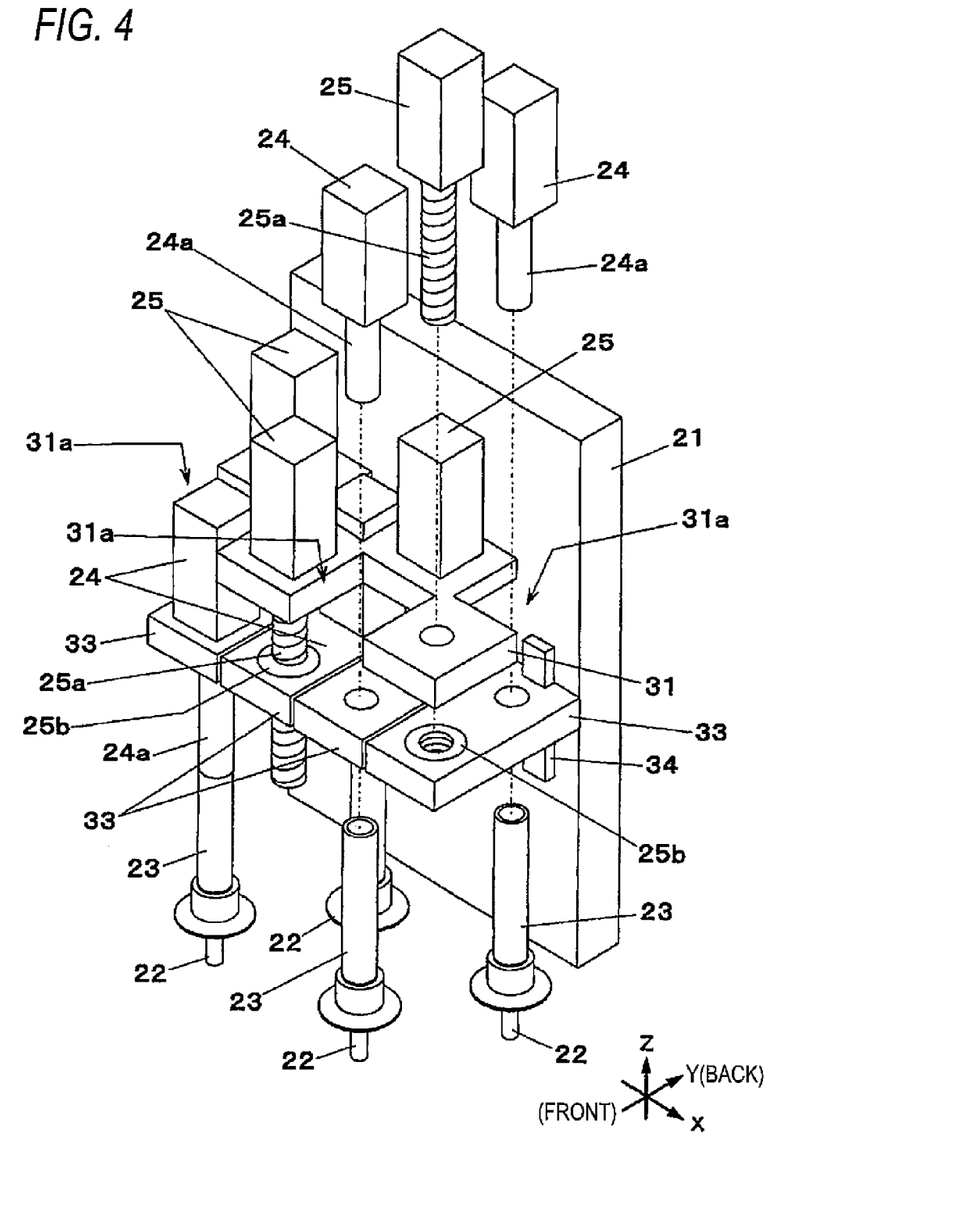
FIG. 4 is an exploded perspective view of the mounting head in the embodiment according to the invention.

In FIGS. 3(a), (b), (c), and FIG. 4, the four rotation driving motors 24 are respectively mounted on the four moving plates 33 in two rows front and back in a staggered arrangement. The rotation driving motors 24 are mounted in such a manner that their downwardly extending driving shafts 24a are respectively passed through the moving plates 33 in the vertical direction (in a direction of thickness), and upper end portions of the shaft members 23 are respectively attached to the driving shafts 24a of the rotation driving motors 24. In this embodiment, the four rotation driving motors 24 are disposed on the four moving plates 33 one by one. When one of the moving plates 33 moves up and down, one of the rotation driving motors 24 mounted on the relevant moving plate 33 moves up and down, and accordingly, the shaft member 23 also moves up and down. Moreover, when the driving shaft 24a of the rotation driving motor 24 is rotated, the shaft member connected to the relevant driving shaft 24a is rotated.

In FIG. 2 and FIGS. 3(a), (b), (c), the four vertical movement driving motors 25 are provided on an upper face of the fixed plate 31 in two rows front and back in a staggered arrangement in an opposite direction to the staggered arrangement of the four shaft members 23. The vertical movement driving motors 25 are mounted in such a manner that ball screws 25a, which are rotation shafts thereof, are respectively passed through the fixed plate 31 from above to below. The ball screws 25a of the vertical movement driving motors 25 are respectively screwed with nuts 25b which are embedded in the moving plates 33 directly below the ball screws 25. Accordingly, when the ball screws 25a are rotated around vertical axes by driving the vertical movement driving motors 25, the moving plates 33 move up and down along the guide members 34, together with the nuts 25b which are screwed with the ball screws 25a. Then, the shaft members 23 attached to the moving plates 33 move up and down, together with the rotation driving motors 24.

Specifically, the mounting head 16 includes a plurality of the shaft members 23 extending in the vertical direction and provided with the suction nozzles 22 at their lower ends, which are arranged in two rows in the staggered arrangement, a plurality of the rotation driving motors 24 which are arranged in two rows in the same staggered arrangement as the staggered arrangement of these shaft members 23, and adapted to individually conduct the rotary movements of the shaft members 23, and a plurality of the vertical movement driving motors 25 which are arranged in two rows in the staggered arrangement in the opposite direction to the staggered arrangement of the shaft members 23, and adapted to individually move the shaft members 23 up and down. Moreover, the rotation driving motors 24 have their downwardly directed driving shafts 24a connected to the shaft members 23, thereby to directly drive the shaft members 23. Meanwhile, the vertical movement driving motors 25 move the shaft members 23 up and down, together with the rotation driving motors 24 which rotate the shaft members 23.

As shown in FIG. 4, the fixed plate 31 is provided with cutout parts 31a having a slightly larger size than an outer shape of each of the rotation driving motors 24, at four positions directly above the four rotation driving motors 24 which are arranged in the staggered arrangement. In this manner, interference between upper parts of the rotation driving motors 24 and the fixed plate 31 can be avoided (See FIG. 2 too).

In FIG. 1, operation for transferring and positioning the board 2 by the board transferring conveyer 12, operation for supplying the component 4 by the part feeders 14, operation for moving the mounting head 16 by the head moving mechanism 15, operation for rotating the shaft members 23 by the rotation driving motors 24, operation for vertically moving the shaft members 23 by the vertical movement driving motors 25, operation for sucking the component 4 through the suction nozzles 22 by a suction mechanism 35 which is provided in the mounting head 16, control of image pickup operation by the board camera 17 and control of image pickup operation by the component camera 18 are performed by a control unit 40 which is provided in the component mounting apparatus 1. Moreover, image data obtained by the image pickup operation by the board camera 17 and image date obtained by the image pickup operation by the component camera 18 are transmitted to the control unit 40, and recognized in an image recognition part 40a in the control unit 40.

In order to conduct a component mounting work for mounting the component 4 to the electrode part 3 on the board 2 using the component mounting apparatus 1 having the above described structure, the control unit 40 first actuates the board transferring conveyer 12 to receive the board 2 which is transferred from the device at the upstream step side of the component mounting apparatus 1. Then, the board 2 is transferred into the component mounting apparatus 1, and positioned at a predetermined working position (Step ST1 in FIG. 5).

After the board 2 has been positioned, the control unit 40 moves the mounting head 16 thereby to move the board camera 17 to a position above the board 2, and allows the board camera 17 to pickup images of a pair of board marks 2m (FIG. 1) on the board 2 thereby to conduct image recognition. Then, comparing the positions of the board marks 2m with reference positions which have been previously set, a positional deviation of the board 2 from the reference positions is calculated (Step ST2 in FIG. 5).

Figure 5:
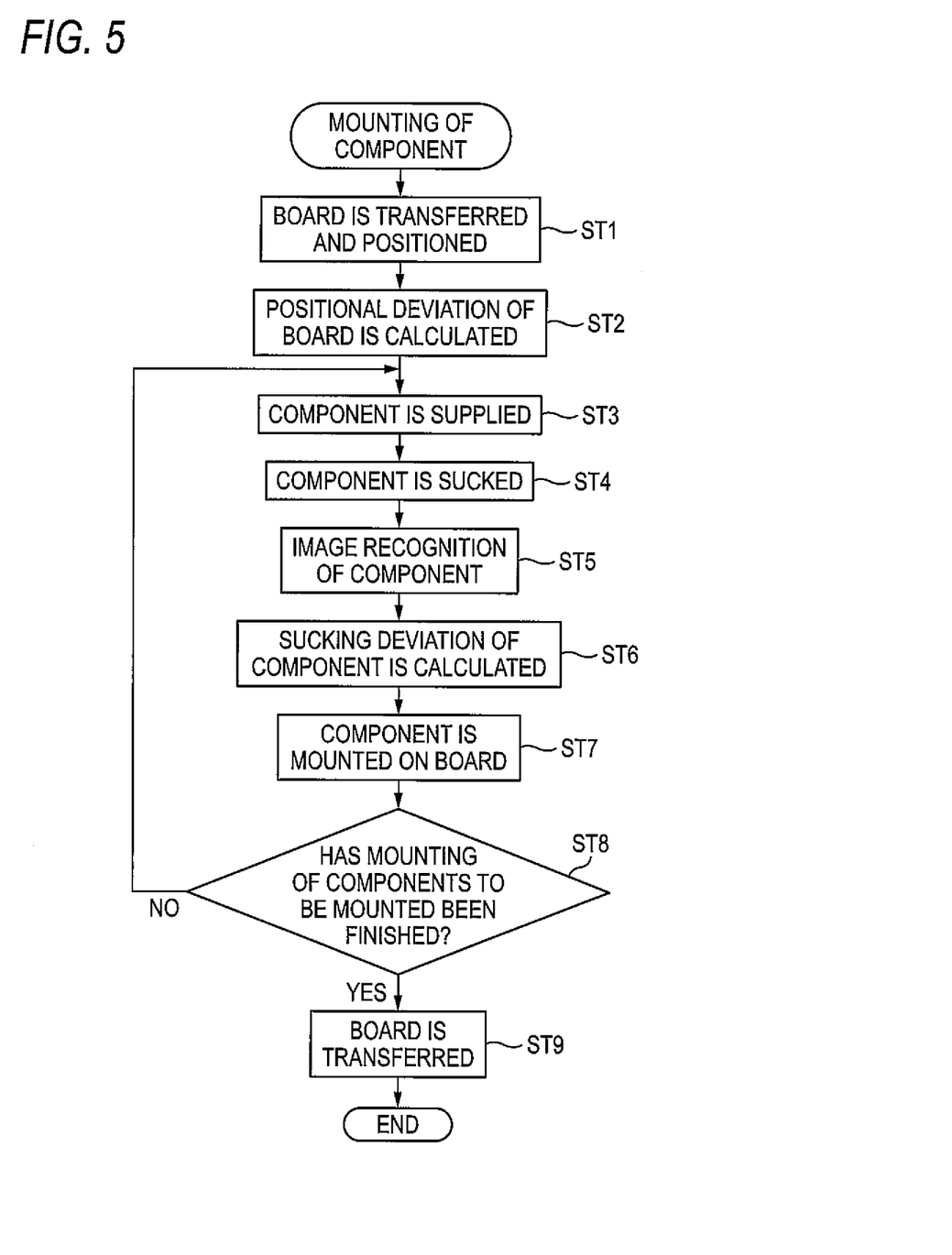
FIG. 5 is a flow chart showing steps of a component mounting work which is carried out by the component mounting apparatus in the embodiment according to the invention.
Figure 6:
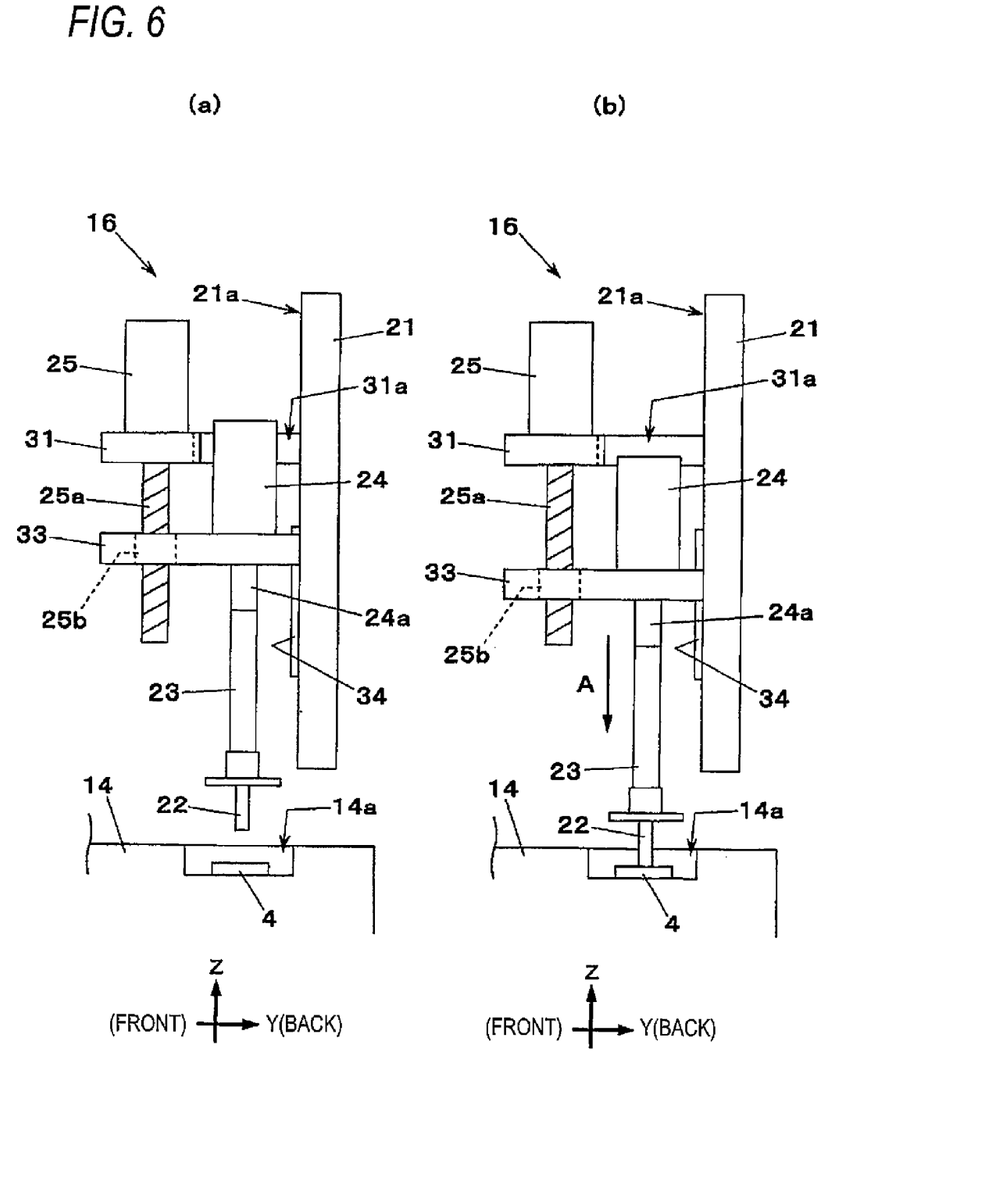
FIGS. 6(a) and 6(b) are side views of the mounting head in the embodiment according to the invention.
Figure 7:
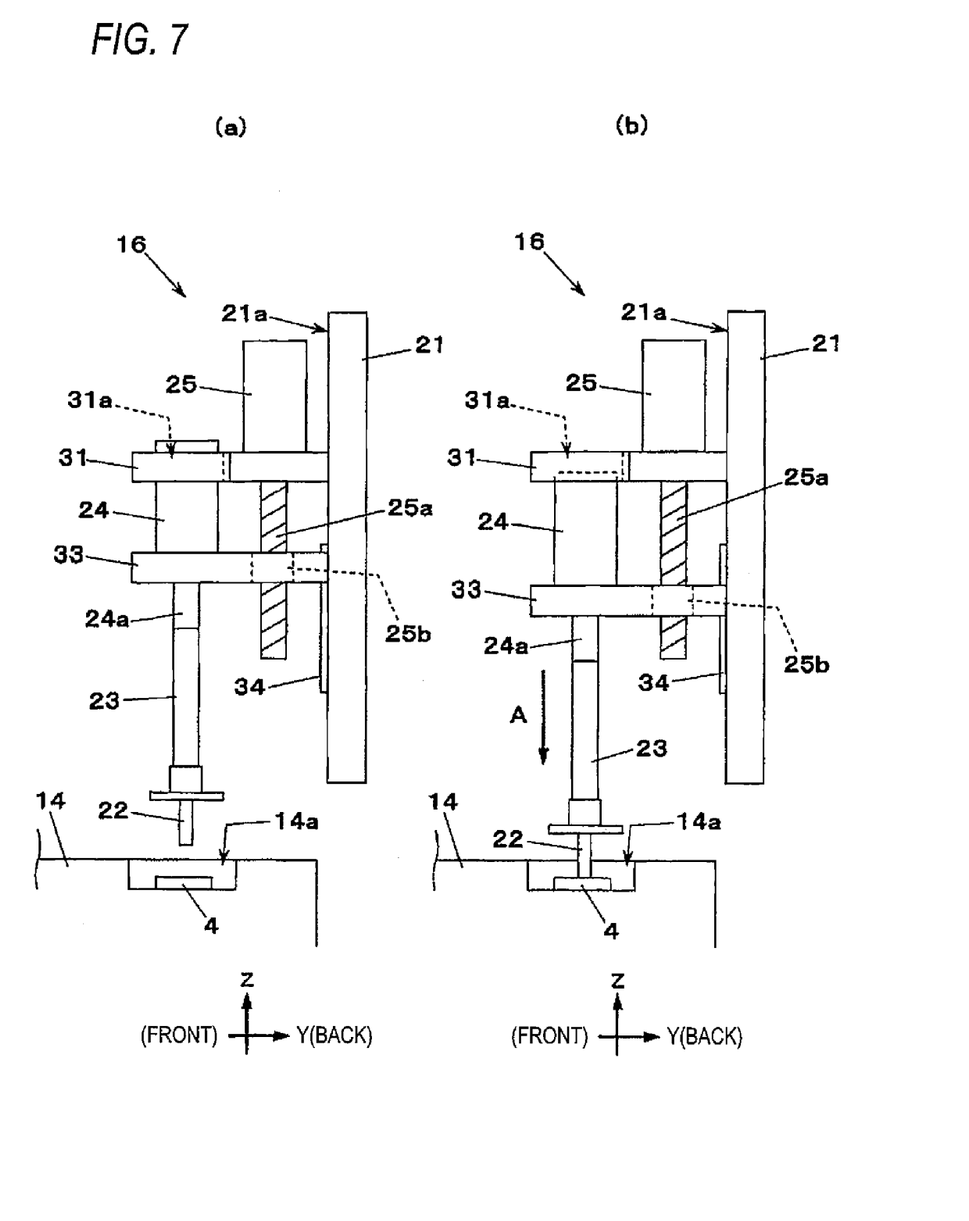
FIGS. 7(a) and 7(b) are side views of the mounting head in the embodiment according to the invention.

After the positional deviation of the board 2 from the reference positions has been calculated, the control unit 40 actuates the part feeder 14 thereby to supply the component 4 to the component supplying port 14a of the part feeder 14 (Step ST3 in FIG. 5). Then, the control unit 40 positions the mounting head 16 above the part feeder 14, and allows the suction nozzle 22 to suck (pick up) the component 4 which has been supplied to the component supplying port 14a of the part feeder 14 (Step ST4 in FIG. 5).

In the sucking operation of the component 4 by the suction nozzle 22, the control unit 40 actuates one of the vertical movement driving motors 25 selectively in order, thereby to move the shaft member 23 up and down (FIG. 6(a) to FIG. 6(b), or FIG. 7(a) to FIG. 7(b). See an arrow mark A in FIG. 6(b) and FIG. 7(b)). After the component 4 has been sucked by the suction nozzle 22 by controlling the suction mechanism 35, the vertical movement driving motor 25 is actuated thereby to move the shaft member 23 which has been lowered, upward to the original position.

After the components 4 have been sucked by the respective suction nozzles 22, the control unit 40 moves the mounting head 16 so that all the components 4 which have been sucked may pass a region above the component camera 18, and allows the component camera 18 to pickup images of the components 4. Then, on the basis of the results of the image pickup, image recognition is conducted (Step ST5 in FIG. 5), and positional deviations (sucking deviations) of the respective components 4 with respect to the suction nozzles 22 are calculated (Step ST6 in FIG. 5).

Figure 8:
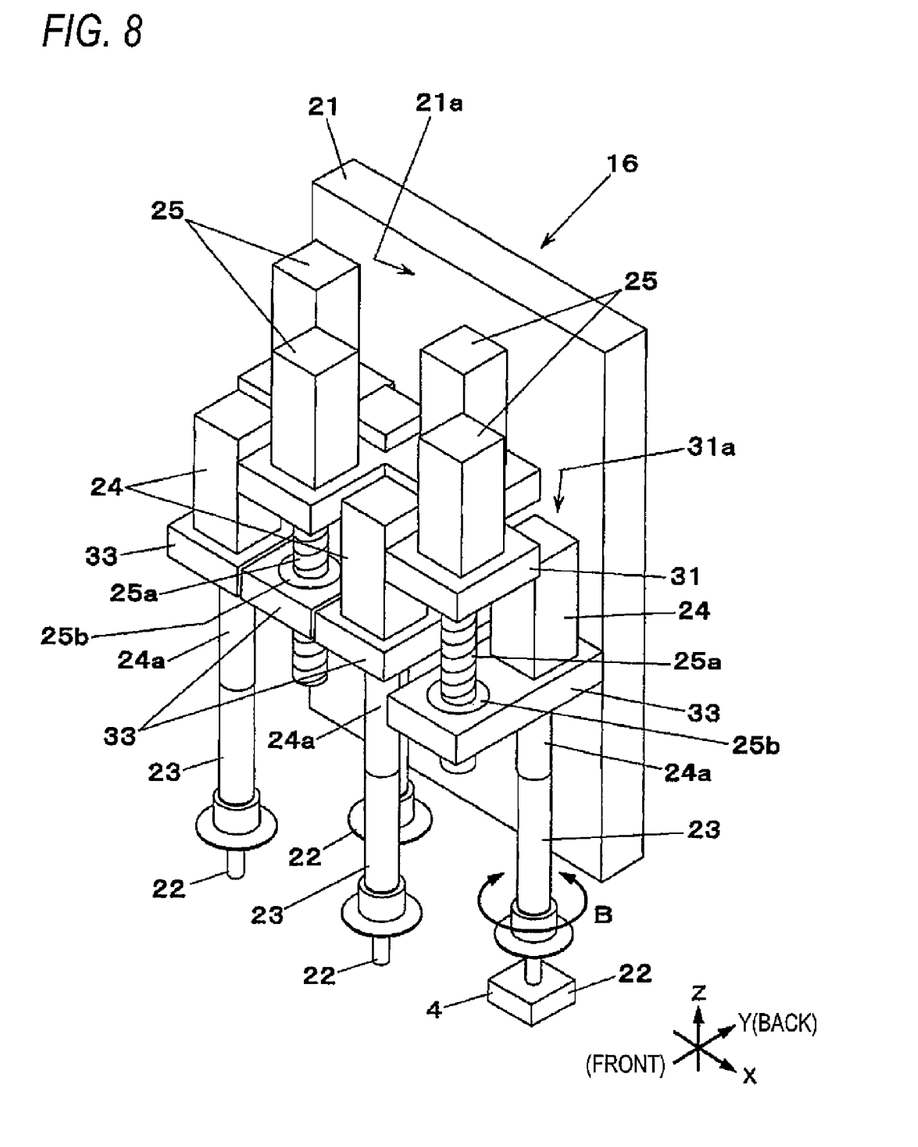
FIG. 8 is a perspective view of the mounting head in the embodiment according to the invention.
Figure 9:
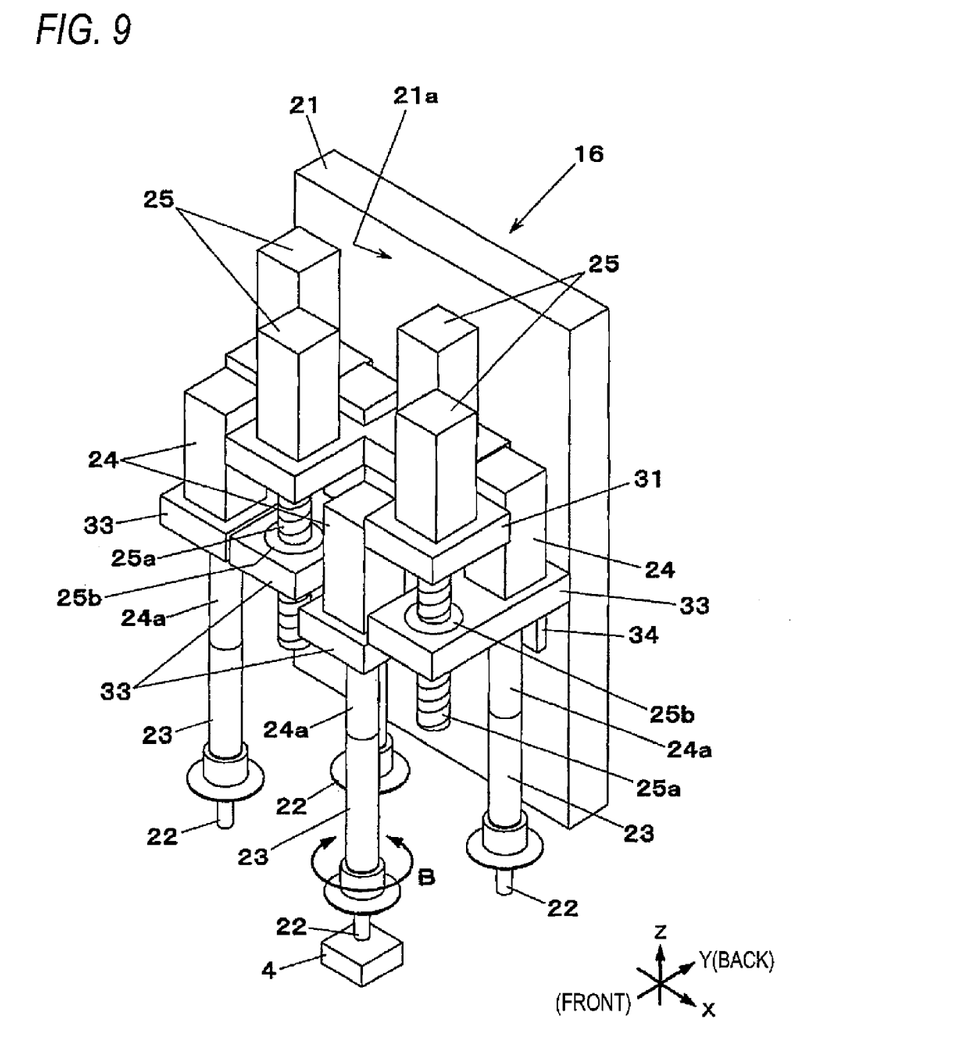
FIG. 9 is a perspective view of the mounting head in the embodiment according to the invention.

After the positional deviations (sucking deviations) of the components 4 with respect to the suction nozzles 22 have been calculated, the control unit 40 positions the mounting head 16 above the board 2, and brings the components 4 which have been sucked by the suction nozzles 22 into contact with the electrode part 3 on the board 2. Then, repeating operations for releasing supply of vacuum pressure to the suction nozzles 22, the control unit 40 mounts all the components 4 which have been sucked, on the board 2 (Step ST7 in FIG. 5). In this step ST7, the control unit 40 corrects the positions of the suction nozzles 22 with respect to the board 2 so that the positional deviation of the board 2 which is obtained in the step ST2 and the sucking deviations of the components 4 which are obtained in the step ST6 may be corrected. This correction of the positions of the suction nozzles 22 includes correction of the rotation of the suction nozzles 22. When the suction nozzles 22 are rotated, the shaft members 23 which have been downwardly moved by the vertical movement driving motors 25 are rotated around vertical axes by the rotation driving motors 24 (See FIG. 8 or 9. Refer to an arrow mark B in these drawings).

After the components 4 have been mounted on the board 2, the control unit 40 judges whether or not mounting of all the components 4 to be mounted on the board 2 has been finished (Step ST8 in FIG. 5). In case where the mounting of all the components 4 to be mounted on the board 2 has not been finished, the control unit 40 returns to the step ST3. In case where the mounting of all the components 4 to be mounted on the board 2 has been finished, the control unit 40 actuates the board transferring conveyer 12 thereby to transfer the board 2 from the component mounting apparatus 1 (Step ST9 in FIG. 5).

According to the invention, a plurality of the shaft members 23 provided on the mounting head 16 are arranged in two rows in the staggered arrangement, and a plurality of the rotation driving motors 24 for individually conducting the rotary movements of the shaft members 23 are arranged in two rows in the same staggered arrangement as the staggered arrangement of these shaft members 23. On the other hand, a plurality of the vertical movement driving motors 25 for individually moving the shaft members 23 up and down are arranged in two rows in the staggered arrangement in the opposite direction to the staggered arrangement of the shaft members 23. Moreover, the rotation driving motors 24 are not attached to the end part of the mounting head 16, but incorporated in the mounting head 16. As the results, it is possible to individually rotate the shaft members 23 thereby to conduct delicate rotation control of the shaft members 23, while downsizing of the mounting head 16 is achieved. Further, the suction nozzles 22 are arranged in the staggered arrangement in a plan view in the same manner as the shaft members 23. As the results, it is possible to suck the component 4 having a larger size, without interfering with the adjacent suction nozzle 22, and therefore, the mounting head 16 is favorably applied also to mounting of the larger-sized component 4.

Moreover, each of the rotation driving motors 24 is so constructed as to directly drive the shaft member 23, by connecting its driving shaft 24*a*, which is directed downward, to the shaft member 23. As the results, accuracy of the rotation control of the shaft member 23 is remarkably enhanced, as compared with such a structure that the driving power of the rotation driving motor 24 is transmitted to the shaft member 23 by belt transmission.

Further, each of the vertical movement driving motors 25 is so constructed as to move the shaft member 23 up and down together with the rotation driving motor 24 which rotates the shaft member 23. As the results, the more simple structure can be obtained, as compared with such a structure that the rotation driving motor 24 is fixed to the base member 21, and the shaft member 23 is relatively moved in the vertical direction with respect to the rotation driving motor 24, when the shaft member is moved up and down. Therefore, manufacturing cost can be remarkably reduced.

In the above described embodiment, the motors (the vertical movement driving motors 25) are shown as the vertical movement driving unit for individually conducting the vertical movements of a plurality of the shaft members 23. However, it is to be noted that instead of these motors, the vertical movement driving unit may include a pneumatic cylinder or the like which moves a vertically extending piston rod up and down thereby to move the moving plates 33 which are connected to the piston rod up and down.

This invention is based on Japanese Patent Application (Application No. 2012-054153) filed on Mar. 12, 2012, the contents of which are hereby incorporated by reference.

INDUSTRIAL APPLICABILITY

According to the invention, there is provided a mounting head and a component mounting apparatus in which delicate rotation control of shaft members can be obtained, while downsizing of the mounting head is achieved.

DESCRIPTION OF THE REFERENCE NUMERALS AND SIGNS

1 Component mounting apparatus
2 Board
4 Component
12 Board transferring conveyer (board positioning part)
14 Part feeder (Component supply part)
16 Mounting head
22 Suction nozzle
23 Shaft member
24 Rotation driving motor
24*a* Driving shaft
25 Vertical movement driving motor (vertical movement driving unit)

The invention claimed is:

1. A mounting head, comprising:
   a plurality of shaft members which are extended in a vertical direction and respectively provided with suction nozzles at their lower ends, the shaft members being arranged in two rows in a staggered arrangement;
   a plurality of rotation driving motors which are arranged in two rows in the same staggered arrangement as the staggered arrangement of the shaft members, and adapted to individually conduct rotary movements of the shaft members; and
   a plurality of vertical movement driving unit which are arranged in two rows in a staggered arrangement in an opposite direction to the staggered arrangement of the shaft members, and adapted to individually conduct vertical movements of the shaft members.

2. The mounting head as claimed in claim 1, wherein driving shafts of the rotation driving motors which are directed downward are connected to the shaft members, whereby the shaft members are directly driven by the rotation driving motors.

3. The mounting head as claimed in claim 1, wherein the vertical movement driving unit moves the shaft members up and down together with the rotation driving motors which rotate the shaft members.

4. A component mounting apparatus comprising: a board positioning part for positioning a board; a component supply part for supplying a component; and a mounting head for sucking the component which is supplied from the component supply part and mounting the component on the board which is positioned by the board positioning part,
   wherein the mounting head comprises:
   a plurality of shaft members which are extended in a vertical direction and respectively provided with suction nozzles at their lower ends, the shaft members being arranged in two rows in a staggered arrangement;
   a plurality of rotation driving motors which are arranged in two rows in the same staggered arrangement as the staggered arrangement of the shaft members, and adapted to individually conduct rotary movements of the shaft members; and
   a plurality of vertical movement driving unit which are arranged in two rows in a staggered arrangement in an opposite direction to the staggered arrangement of the shaft members, and adapted to individually conduct vertical movements of the shaft members.

5. The component mounting apparatus as claimed in claim 4, wherein driving shafts of the rotation driving motors which are directed downward are connected to the shaft members, whereby the shaft members are directly driven by the rotation driving motors.

6. The component mounting apparatus as claimed in claim 4, wherein the vertical movement driving unit moves the shaft members up and down together with the rotation driving motors which rotate the shaft members.

* * * * *